United States Patent [19]

Kimura et al.

[11] Patent Number: 5,150,055
[45] Date of Patent: Sep. 22, 1992

[54] NUCLEAR MAGNETIC RESONANCE EXCITING DEVICE

[75] Inventors: Mitsuyoshi Kimura, Katsuta; Yoshikazu Amano, Ibaraki, both of Japan

[73] Assignee: Hitachi, Ltd., Tokyo, Japan

[21] Appl. No.: 618,931

[22] Filed: Nov. 28, 1990

[30] Foreign Application Priority Data

Dec. 1, 1989 [JP] Japan .................. 1-313200

[51] Int. Cl.$^5$ ............................................. G01R 33/20
[52] U.S. Cl. ............................................. 324/322
[58] Field of Search ............... 324/300, 307, 308, 309, 324/310, 311, 312, 313, 314, 318, 322; 128/653 A, 653 SC

[56] References Cited

U.S. PATENT DOCUMENTS

| | | | |
|---|---|---|---|
| 4,585,995 | 4/1986 | Flugan | 324/322 |
| 4,698,591 | 10/1987 | Glover et al. | 324/307 |
| 4,701,706 | 10/1987 | Haacke | 324/309 |
| 4,864,241 | 9/1989 | Goldie | 324/318 |
| 4,881,032 | 11/1989 | Bottomley et al. | 324/309 |
| 4,896,112 | 1/1990 | Ratzel et al. | 324/309 |
| 4,928,063 | 5/1990 | Lampman et al. | 324/307 |
| 4,965,521 | 10/1990 | Egloff | 324/312 |

*Primary Examiner*—Michael J. Tokar
*Attorney, Agent, or Firm*—Antonelli, Terry, Stout & Kraus

[57] ABSTRACT

A gradient magnetic field coil is excited by coil exciting means, thereby a gradient magnetic field being generated. The gradient magnetic field generates eddy current in an eddy current generating portion, the magnetic field due to this eddy current disturbing the gradient magnetic field. Means for compensating the magnetic field due to the eddy current is disposed, this means having a transmission function representing an inverse of the transmission function of a gradient magnetic field system including the gradient magnetic field coil and the eddy current generating portion.

10 Claims, 5 Drawing Sheets

NUCLEAR MAGNETIC RESONANCE EXCITING DEVICE

BACKGROUND OF THE INVENTION

1. Field of the Invention

The present invention relates to a nuclear magnetic resonance exciting device such as a magnetic resonance imaging device, and in particular to a nuclear magnetic resonance exciting device having means compensating magnetic field produced by eddy current due to a gradient magnetic field.

2. Description of the Related Art

In a magnetic resonance imaging (MRI) device, which is a kind of nuclear magnetic resonance exciting devices, since magnetic field produced by eddy current due to a gradient magnetic field disturbs the gradient magnetic field, usually a measure for compensating it is taken.

Such a technique for compensating the magnetic field produced by eddy current is disclosed in U.S. Pat. No. 4,585,995 published Apr. 29, 1986. Analyzing the electric circuit part for compensating eddy current disclosed therein, it can be known that the transmission function used for the compensation in the eddy current compensating circuit is given by following Eq. (2) obtained by adding the total sum of transmission functions expressed by Eq. (1) and 1, part corresponding to the input;

$$H_i(s) = \frac{k_i T_i s}{1 + T_i s} \quad (1)$$

where $k_i$, $T_i \geq 0$ $$H_c(s) = 1 + \sum_{i=1}^{N} H_i(s) \quad (2)$$

As it can be clearly seen from above Eq. (2), in the construction for compensating the eddy current a method is adopted, by which influences produced by the eddy current are preestimated and fed back in order to generate an additive approximative inverse function, and neither circuit theoretical consideration on the cause of generation of the eddy current nor circuit theoretical construction of the eddy current compensating method is effected.

Originally, in the case where waveform distorsion in the gradient magnetic field due to eddy current is corrected in the eddy current compensating device for an MRI device, perfect compensation cannot be effected, unless such a transmission function that it compensates a transmission function including a factor of generating waveform distorsion is disposed in the compensating circuit portion. In the eddy current compensating circuit described above no attention is paid at all with respect to this point.

Further the circuit portion for the eddy current compensation described above has a problem that adjustment precision cannot be high, because it is constructed by adopting the additive approximative inverse function generating method and therefore adjustment is troublesome because of a number of parameters included for the adjustment and at the same time errors are accumulated for different parameters at the adjustment because of the construction.

SUMMARY OF THE INVENTION

An object of the present invention is to provide a nuclear magnetic resonance exciting device capable of compensating eddy current.

Another object of the present invention is to provide a nuclear magnetic resonance exciting device capable of compensating eddy current with a high precision.

Still another object of the present invention is to provide a nuclear magnetic resonance exciting device suitable for decreasing the number of parameters for adjustment.

According to the present invention, in a nuclear magnetic resonance exciting device comprising means for generating a static magnetic field—a sample being located therein—means for generating a gradient magnetic field; means for driving the gradient magnetic field generating means so as to superpose the gradient magnetic field on the static magnetic field; means for generating a radio frequency pulse; and means for exciting nuclear magnetic resonance of the sample by applying the radio frequency pulse under the presence of the gradient magnetic field; the nuclear magnetic resonance exciting device comprises a gradient magnetic field system; the gradient magnetic field system comprises the gradient magnetic field generating means and an eddy current effect generating portion, where the eddy current effect is generated due to the gradient magnetic field; the means for driving the gradient magnetic field generating means comprises means for compensating the generated eddy current effect; and the eddy current effect compensating means has an inverse of the transmission function of the gradient magnetic field system as a transmission function.

Objects and features of the present invention other than those described above will be obvious from the following explanation made, referring to the drawings.

DESCRIPTION OF THE PREFERRED EMBODIMENTS

Figure 1:
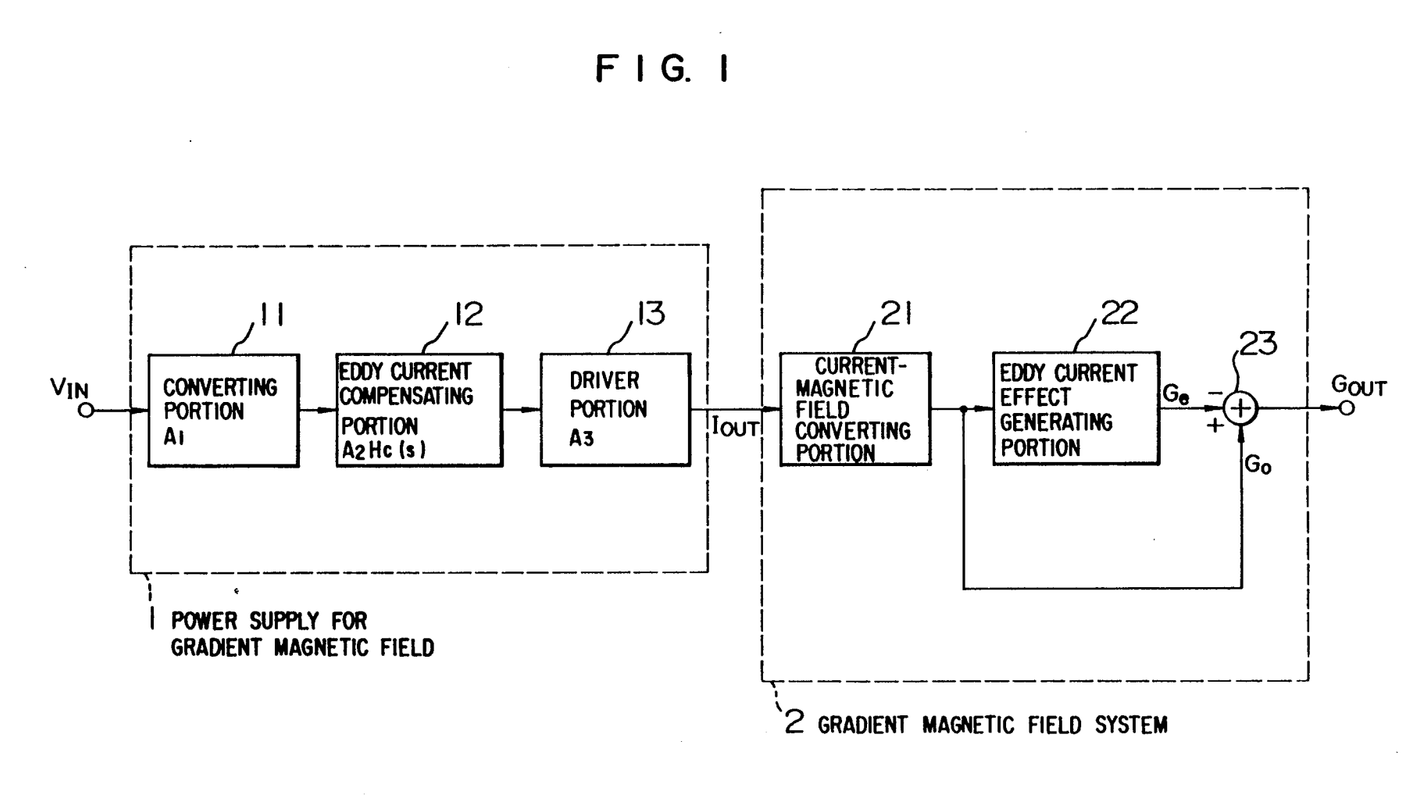
FIG. 1 is a block diagram for explaining the principle of the eddy current compensating method according to the present invention.

The construction of the eddy current compensating circuit in an MRI device according to the present invention will be explained in principle, referring to FIG. 1. In FIG. 1, reference numeral 1 represents a power supply for gradient magnetic field indicating different elements constituting the transmission function in a block diagram and 2 expresses a gradient magnetic field system composed of gradient magnetic field coils of the MRI device in a block diagram representing the transmission function. This gradient magnetic field system 2 includes also the magnetic field produced by the eddy current. The circuit construction indicated in FIG. 1 is valid for each of the gradient magnetic field coils for x-axis, y-axis and z-axis.

A current output instruction $V_{IN}$ is given to the power supply for gradient magnetic field 1 as an input signal. The power supply for gradient magnetic field 1 executes a plurality of necessary converting operations for this instruction to output a current signal $I_{OUT}$ corresponding to the current output instruction $V_{IN}$. The power supply for gradient magnetic field 1 consists of a converting portion 11, an eddy current compensating portion 12 and a driver portion 13. The converting portion 11 has a function of converting the current output instruction $V_{IN}$ given e.g. in a digital signal form into an electric signal, e.g. a current signal, $A_1$ being a conversion coefficient therefor. The eddy current compensating portion 12 is a circuit element disposed for the purpose of compensating the magnetic field due to the eddy current produced by the gradient magnetic field system 2, i.e. circuit element for compensating the eddy current, whose transmission function is given by $A_2H_c(s)$. In this transmission function, $A_2$ is a coefficient and the function $H_c(s)$ is an inverse function for compensating the eddy current, given on the basis of a relationship described later. The driver portion 13 amplifies a current signal obtained by the eddy current compensating portion 12, in which current signal the eddy current compensation has been already executed, to output it as an current signal $I_{OUT}$ for driving the gradient magnetic field coil. A transmission function $A_3$ is a conversion coefficient therefor.

Consequently the transmission function Hp(s) of the whole power supply for gradient magnetic field 1 from $V_{IN}$ to $I_{OUT}$ is expressed by following Eq. (3);

$$Hp(s) = A_1 A_2 A_3 H_c(s) \quad (3)$$

In the equation described above, it is supposed that response characteristics of the converting portion 11 and the driver portion 13 are ideal. In practice, since the response speed thereof can be higher than those of an eddy current effect generating portion in the gradient magnetic field system 2 described later, it is possible to deal with them, idealized as described above.

Next the gradient magnetic field system 2 will be explained. In the gradient magnetic field system 2, 21 is a curent-magnetic field converting portion; 22 is an eddy current effect generating portion; and 23 is an adder. In this adder 23 is obtained the sum of the output value $G_o$ of the current-magnetic field converting portion 21 and the output value $G_e$ of the eddy current effect generating portion 22, both having connected directly therewith. However $G_e$ is added with a negative sign and therefore in reality, the difference therebetween is obtained. The gradient magnetic field system 2 is expressed by such a circuit construction, because the gradient magnetic field system 2 can be expressed as a sum of the gradient magnetic field $G_o$, in the case where there is no eddy current effect, and the magnetic field $G_e$ having the opposite polarity, produced by the eddy current. In practice, the current-magnetic field converting portion 21 means a gradient magnetic field coil, in which the current signal $I_{OUT}$ described previously is inputted, and which is excited by this current to generate the required gradient magnetic field. $B_1$ is a conversion coefficient relating the exciting current with the gradient magnetic field. Further, in practice, since the gradient magnetic field $G_{OUT}$ is subjected to the action of the magnetic field due to the eddy current, it is necessary to have the eddy current effect generating portion 22 included as a circuit element. The transmission function $B_2H_e(s)$ of the eddy current effect generating portion 22 represents the magnetic field generated due to the eddy current as a transmission function. Now, when the transmission function $H_G(s)$ of the gradient magnetic field system 2 determining the relation between the current signal $I_{OUT}$ on the input side and the gradient magnetic field $G_{OUT}$ in the gradient magnetic field system 2 is obtained on the basis of FIG. 1, it is expressed by following Eq. (4);

$$H_G(s) = B_1\{1 - B_2 H_e(s)\} \quad (4)$$

Consequently the transmission function $H_T(s)$ from the current output instruction $V_{IN}$ to the gradient magnetic field $G_{OUT}$ is given by following Eq. (5) by using Eqs. (3) and (4) described previously;

$$H_T(s) = A_1 A_2 A_3 H_c(s) \times B_1\{1 - B_2 H_e(s)\} \quad (5)$$

In order that the gradient magnetic field $G_{OUT}$ has the waveform indicated by the current output instruction $V_{IN}$, it is necessary that the element $H_c(s)$ of the transmission function excluding the coefficient $A_2$ in the eddy current compensating portion 12 of the power supply for gradient magnetic field 1 is the inverse function of the element $H_e(s)$ of the transmission function excluding the coefficient $B_2$ of the gradient magnetic field system 2. This relation is expressed by following Eq. (6);

$$H_c(s) = \frac{1}{1 - B_2 H_e(s)} \quad (6)$$

If the eddy current compensating portion 12 satisfies Eq. (6) stated above, it is possible to remove completely the effect of the eddy current in the gradient magnetic field system 2. As explained above, since the compensation of the eddy current can be effected with a high precision by applying the principle described previously to an MRI device, it is possible to obtain an image of high quality as an MR image.

Next how to obtain the transmission function $H_e(s)$ described above will be explained.

According to the theory of the electromagnetics partial differential equations governing the eddy current are given by following Eqs. (7) and (8)

$$\Delta |H_e = \frac{4\pi\mu\sigma}{C^2} \frac{\partial |H_e}{\partial t} \quad (7)$$

$$\nabla \times |H_e = \frac{4\pi}{C} \mathbb{J}_e \quad (8)$$

where $\mu$, $\sigma$, C, |H and J in the above equations represent the permeability, the conductivity, the light velocity, the magnetic field vector and the current density vector, respectively, and the operators $\Delta$ and $\nabla$ represent a Laplacian and a nabla, respectively.

Since the above Eq. (8) takes only the magnetic field generated by the eddy current into account, it is necessary to add a term of the external magnetic field serving as the source of the eddy current thereto as indicated by the following equation;

$$\Delta |H_e = \frac{4\pi\mu\sigma}{C^2} \frac{\partial |H_e}{\partial t} - \frac{4\pi\mu\sigma}{C^2} \frac{\partial |H_o}{\partial t} \quad (9)$$

Variable-separating $|H_e$ and $|H_o$ in Eq. (9) stated above into a function of position and a function of time, subjecting the function of position to a Fourier transformation, subjecting the function of time to a Laplace transformation, rearranging the coefficients, following Eq. (10) can be obtained;

$$|H_m(p, q, r) \cdot L_e(s) = K^* \frac{T_s}{T_s + 1} |H_o(p, q, r) \cdot L_o(s) \quad (10)$$

On the basis of Eq. (10) described above, in the case where the gradient magnetic field system including the eddy current effect is dealt with as a concentrated constant circuit system, it is clear that the transmission function $H_e(s)$ of the output $L_e(s)$ with respect to the input $L_o(s)$ is expressed by following Eq. (11);

$$H_e(s) = K^* \frac{T_s}{T_s + 1} \quad (11)$$

Further, taking the number and the shape of magnet members, in which eddy current flows, as well as boundary conditions into account, the following equation is given as a transmission function representing the global eddy current effect;

$$H_e(s) = - \sum_{i=1}^{N} \frac{k_i T_i s}{T_i s + 1} \quad (12)$$

Here the negative sign is added to the above equation, because the direction of the magnetic field generated by the eddy current is opposite to that of the original gradient magnetic field.

As it is clearly seen from the above explanation, as indicated by Eq. (6), a theoretically perfect eddy current compensation is possible, if the inverse function, whose original function is the element $\{1 - B_2 H_e(s)\}$ of the transmission function of the gradient magnetic field system 2 including the effect of the eddy current, is generated in the eddy current compensating portion 12 of the power supply of gradient magnetic field 1.

Next the concrete construction of the element $H_e(s)$ of the transmission function of the eddy current compensating portion 12 constructed so as to generate the inverse function will be explained, referring to FIGS. 2 and 3. In this embodiment the inverse function is generated by means of an operational amplifier.

Figure 2:
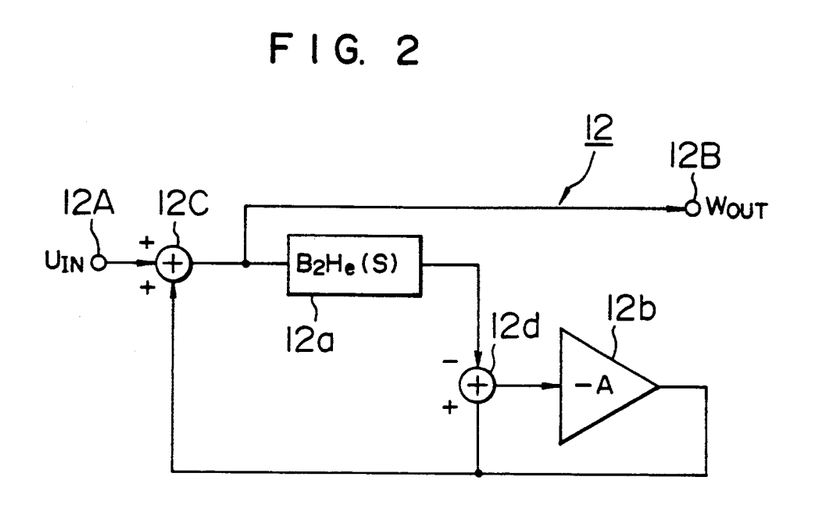
FIG. 2 is a circuit diagram indicating a concrete construction of the device for generating the inverse function for the eddy current compensating portion.
Figure 3:
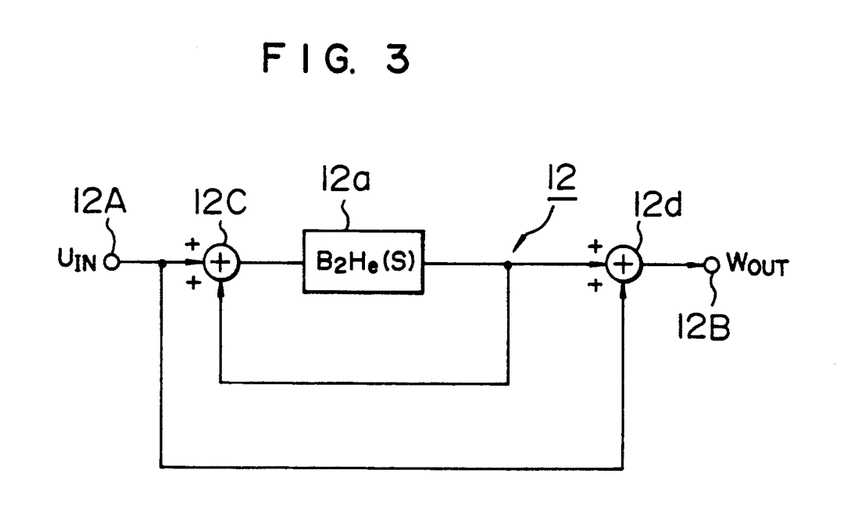
FIG. 3 is a circuit diagram indicating another concrete construction of the device for generating the inverse function for the eddy current compensating portion.

In FIG. 2, 12A is an input terminal of the eddy current compensating portion 12 and 12B is an output terminal thereof. It is supposed that the input entering the input terminal 12A is represented by $U_{IN}$ and the output going out from the output terminal 12B by $W_{out}$. The eddy current compensating portion 12 indicated in FIG. 2 consists of a compensation responding portion 12a having a transmission function of $B_2 H_e(s)$, an amplifying portion 12b having an amplification factor of $-A$, a first and a second adder 12c and 12d. The adder 12d adds a term obtained by adding the negative sign to the output of the compensation responding portion 12a and the output of the amplifier 12b and the output of the addition is inputted in the amplifier 12b. The adder 12c adds the input $U_{IN}$ and the output of the amplifier 12b. The output of the addition is inputted in the compensation responding portion 12a and at the same time taken out from the output terminal 12B as the output $W_{OUT}$. The transmission function from the input $U_{IN}$ to the output $W_{OUT}$ in the eddy current compensating portion 12 having such a connection construction is obtained as follows;

$$H_c(s) = \frac{1 + A}{1 + \{1 - B_2 H_e(s)\}A} \quad (13)$$

In this Eq. (13), if the amplification factor A given by the amplifier 12b is set at infinity, the following equation is obtained;

$$H_c(s) = \frac{1}{1 - B_2 H_e(s)} \quad (14)$$

As it is clearly seen from Eq. (14) described above, if the amplification factor A of the amplifying portion 12b is sufficiently great, as indicated by Eq. (6), the inverse function of the transmission function of the gradient magnetic field system 2 including the eddy current effect can be obtained in a region of sufficiently small errors.

Further Eq. (14) described above can be transformed into the following equation;

$$H_c(s) = 1 + \frac{B_2 H_e(s)}{1 - B_2 H_e(s)} \quad (15)$$

On the basis of Eq. (15) stated above it is possible to realize the eddy current compensating portion 12 having a circuit construction as indicated in FIG. 3. Since the circuit indicated in FIG. 3 can be composed of a compensation responding portion 12a and two adders 12c and 12d and it is not necessary to use the amplifier 12b as in the embodiment described previously, the construction is simplified. Since the circuit indicated in FIG. 3 has the same transmission function as that of the circuit indicated in FIG. 2, it generates an inverse function similar to that of the circuit indicated in FIG. 2 and has the function of compensating the eddy current.

Although, in the above embodiment, distorsion in the waveform of the gradient magnetic field due to the eddy current is corrected by making the required inverse function act on the signal of the current output instruction $V_{IN}$, it is possible also to construct the device so that a current output instruction, on which the inverse function has been made act, is inputted in the power supply for gradient magnetic field 1 and the eddy current compensating portion 12 is omitted in the power supply for gradient magnetic field 1 or a part thereof is simplified. Also in this case it is possible to eliminate influences of the eddy current produced in the gradient magnetic field system 2 in the same way as in the case of the embodiment described previously. That is, the same effect as described above can be obtained, if the element producing the inverse function is disposed at a position before the power supply for gradient magnetic field 1.

Now a concrete example of the circuit for the eddy current compensating portion 12 will be explained, referring to FIGS. 4 to 6. The concrete circuit indicated in FIG. 4 realizes the block diagram representing the transmission function indicated in FIG. 2 in the form of a real circuit.

Figure 4:
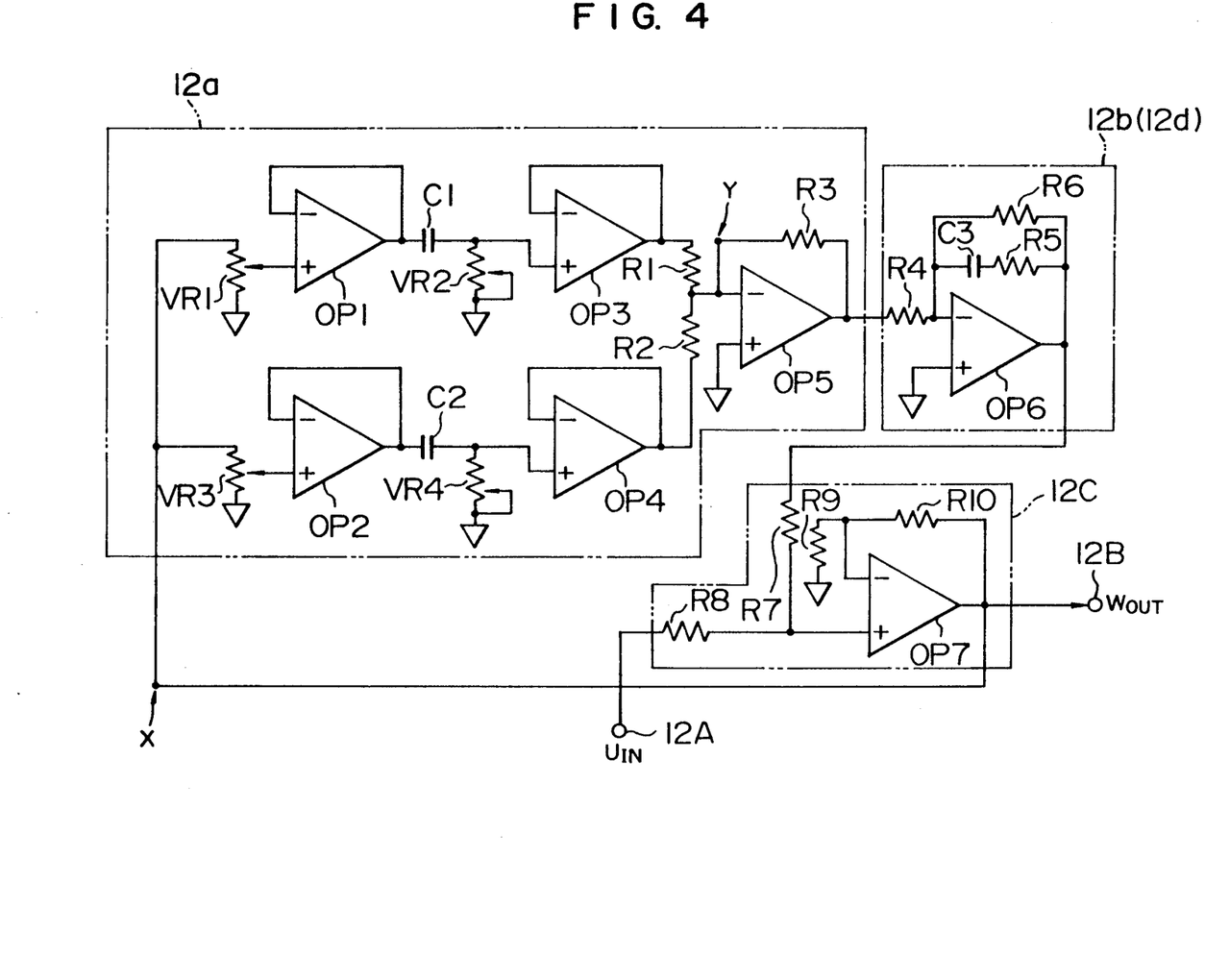
FIG. 4 is a circuit diagram of an inverse function generator constructed in practice using operational amplifiers, etc.

In FIG. 4, various parts enclosed by alternate long and two short dash lines represent different blocks, among which 12a is the compensation responding portion; 12b is the amplifying portion; and 12c is the adder. The other adder 12d in FIG. 2 is included functionally in the amplifier 12b. Further 12A is the input terminal and 12B is the output terminal described previously.

The compensation responding portion 12a consists of five operational amplifiers OP1 to 5, variable resistors VR1 to VR4, capacitors $C_1$ and $C_2$, and resistors $R_1$ to $R_3$. The eddy current compensating portion 12a having the construction indicated in FIG. 4 is constructed under a supposition that there are two proper solutions in Eq. (9) described above governing the eddy current. As the result, the transmission function $H_c(s)$ of the compensation responding portion 12a is given by;

$$H_c(s) = -\sum_{i=1}^{2} \frac{k_i T_i s}{T_i s + 1} \tag{16}$$

With respect to i = 1, 2, the circuit portions having fundamental transmission functions $k_i T_i s/(T_i s+1)$ corresponding to them are realized by a circuit portion consisting of OP1, OP3, VR1, VR2, $C_1$, $R_1$ and another consisting of OP2, OP4, VR3, VR4, $C_2$, $R_3$. In each of these circuit portions, the eddy current compensation coefficient $k_i$ of the relevant circuit portion can be set by means of the variable resistor VR1 or VR3 and the time constant $T_i$ of the circuit portion can be set by means of the variable resistor VR2 or VR4. The transmission functions of the different circuit portions having transmission functions $k_i T_i s/(T_i s+1)$ are added in the adder consisting of the operational amplifier OP5 and the resistor $R_3$.

The amplifying portion 12b (including the function of the adder 12d) is composed of the operational amplifier OP6 and the resistors $R_4$ and $R_6$. The capacitor $C_3$ and the resistor $R_5$ included in the amplifying portion 12b play the role of compensating the phase for the purpose of stabilizing the whole circuit indicated in FIG. 4.

Further the adder 12c is composed of the operational amplifier OP7 and the resistors $R_7$ to $R_{10}$. The input $U_{IN}$ inputted through the resistor $R_8$ and the output of the amplifying portion 12b inputted through the resistor $R_7$ are inputted in the non-inverted input terminal (+) of the operational amplifier OP7 in the state where they are added to each other. The output of the adder 12c is taken out through the output terminal 12B as the output $W_{OUT}$ and at the same time supplied to the compensation responding portion 12a stated above.

According to the circuit construction described above, the transmission function $H_c(s)$ generated by the circuit indicated in FIG. 4 is expressed by the following equation and in this way it is possible to correct the distorsion in the gradient magnetic field due to the eddy current generated in the gradient magnetic field system 2.

$$H_c(s) = \frac{1}{1 - \sum_{i=1}^{2} \frac{k_i T_i s}{T_i s + 1}} \tag{17}$$

Figure 5:
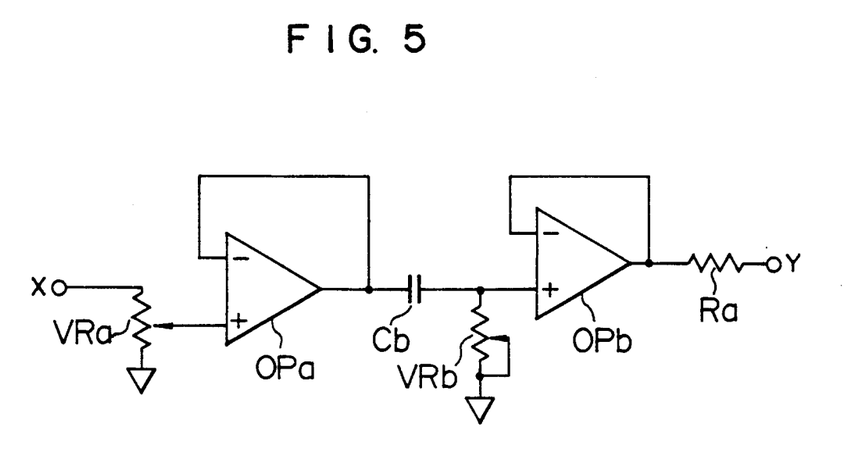
FIG. 5 is a circuit diagram of a circuit portion added for enlarging the circuit.

Although, in the circuit described above, it is supposed that there are two proper solutions, in the case where there exist more proper solutions having serious influences causing distorsions in the waveform of the gradient magnetic field due to various causes in the device and boundary conditions, a number of circuit portions indicated in FIG. 5 corresponding to the number of the proper solutions may be connected in parallel between the point X and the point Y in the circuit in FIG. 4. The circuit portions indicated in FIG. 5 have the same construction as each of the circuit portions described previously having the transmission function $k_i T_i s/(T_i s+1)$ indicated in the eddy current compensating portion 12a in FIG. 4. The circuit portion indicated in FIG. 5 includes two operational amplifiers OPa and OPb and it is constructed by connecting them together with variable resistors VRa and VRb, a capacitor Cb and a resistor Ra as indicated in the figure. Each of the operational OPa and OPb is constructed by a voltage follower and can regulate the eddy current compensating coefficient by means of the variable resistor VRa and the time constant by means of the variable resistor VRb. It has such a structure that the regulation of the eddy current compensation coefficient and that of the time constant don't interfere with each other. It is possible to set the eddy current compensation coefficient at zero, depending on the construction of the variable resistor VRa. The value of the time constant $T_i$ is regulated usually in a region between 1 m sec and 5 sec and the eddy current compensation coefficient $k_i$ in a region between 0 and 100%. Although the coefficient B is not included in Eq. (16), it can be thought that it is included in the compensation coefficient.

Figure 6:
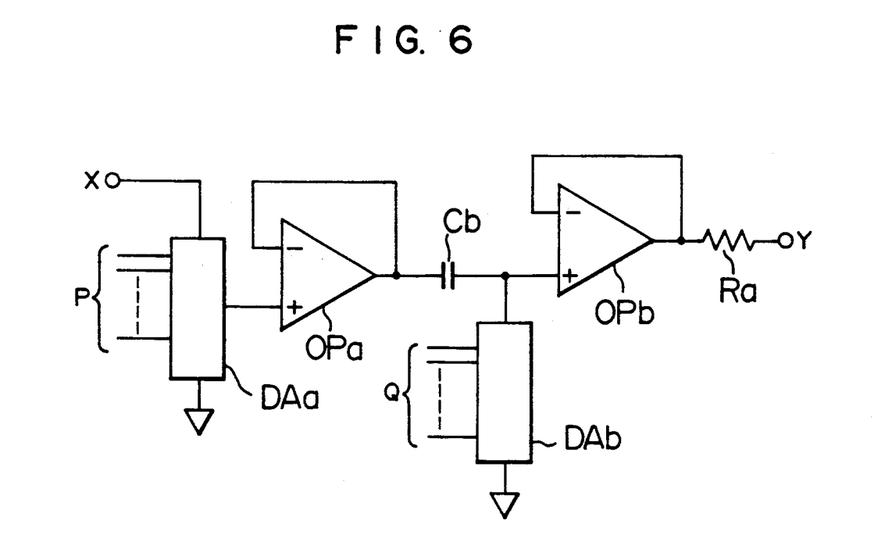
FIG. 6 is a circuit daigram of other circuit portions added for enlarging the circuit.

FIG. 6 indicates another embodiment of the circuit portion having the transmission function $k_i T_i s/(T_i s+1)$. In this embodiment the operational amplifiers OPa and OPb, the capacitor Cb and the resistor Ra are identical to those indicated in FIG. 5 and D-A converters DAa and DAb are used in lieu of the variable resistors VRa and VRb. This embodiment is so constructed that the eddy current compensation coefficient $k_i$ and the time constant $T_i$ are set by digital instructions from a computer. Concretely speaking, the eddy current compensation coefficient $k_i$ is set by a digital signal P inputted in the D-A converter DAa and the time constant $T_i$ is set by another digital signal Q inputted in the D-A converter DAb.

As it is clearly seen from the above explanation, following effects are obtained according to the present invention.

In a magnetic resonance imaging device, since the transmission function of the gradient magnetic field including the eddy current effect produced in the gradient magnetic field system is used in order to generate the inverse function thereof and a device generating the inverse function is disposed in or before the power supply for gradient magnetic field, the compensation of the eddy current can be effected theoretically perfectly and it is possible to effect the eddy current compensation with a high precision.

Further, if the inverse function is generated by using the fundamental transmission function $k_i T_i s/(T_i s+1)$, a theoretically correct inverse function can be obtained so that the eddy current compensation can be effected with a high precision. Further, since the regulation can be effected by using at least two regulation parameters, the eddy current compensation coefficient and the time constant, regulation operation is facilitated and compensation precision is increased.

Since the device is so constructed that the eddy current compensation coefficient and the time constant are variable, fluctuations in the compensating coefficient and the time constant due to fluctuations in used circuit elements and fabrication of the device can be removed by regulation.

Since the device is so constructed that the regulation of the compensating coefficient and that of the time constant don't interfere with each other, regulation operation is facilitated, regulation precision is increased and further the device is suitable for automatic regulation using a computer.

Furthermore, concerning the region of the regulation of the compensation coefficient, since the device is so constructed that the lower limit thereof can be set at 0, and effect can be obtained that at the initial measurement the compensation coefficient and the time constant can be measured, neither detaching the eddy current compensating portion from the circuit nor dismounting the circuit elements from the circuit.

Since the eddy current compensating portion is constructed by using operational amplifiers, etc., the inverse function can be easily generated and therefore the device has an extremely high practicability.

Figure 7:
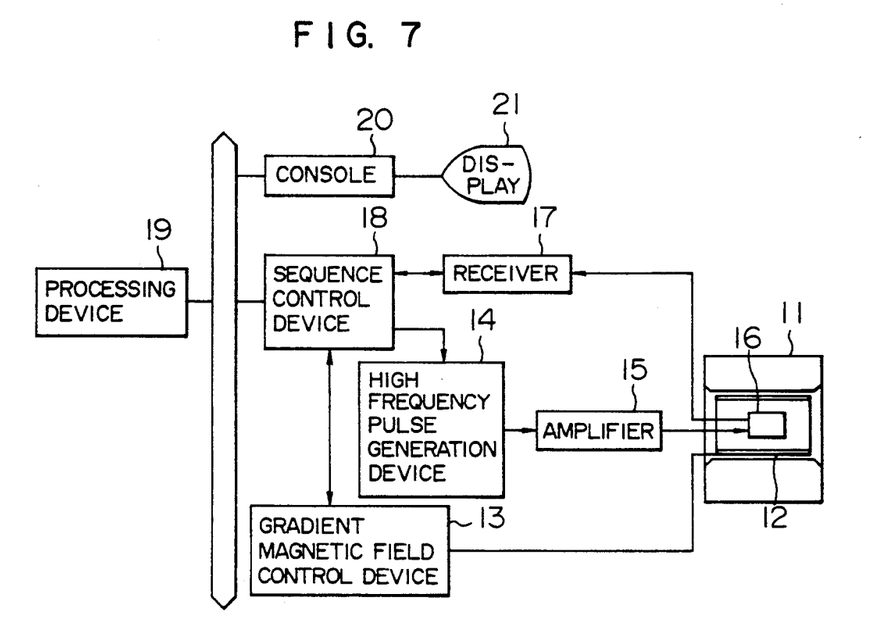
FIG. 7 is a block diagram of an embodiment of the magnetic resonance imaging device, to which the eddy current compensating technique according to the present invention is applied.

Referring to FIG. 7, a static magnetic field generation device 11, into which samples are inserted, may be either of a superconductivity type, an electromagnetic type and a permanent magnetic type. In the static magnetic field generation device 11 a gradient magnetic field coil 12 is disposed so as to surround a sample, and is connected to a gradient magnetic field control device 13 which controls the application of the gradient magnetic field in the x, y and z directions to the static magnetic field generated by the static magnetic field generation device 11. A radio frequency pulse generation device 14 is connected to a transmitter-receiver coil 16 through an amplifier 15 so as to apply the radio frequency pulse generated thereby to the sample. To the transmitter-receiver coil 16 also a receiver 17 is connected for receiving a nuclear magnetic resonance signal obtained from the sample.

A sequence control device 18 is connected to the gradient magnetic field control device 13, the radio frequency pulse generation device 14, and the receiver 17, and controls the respective timings of generation of the radio frequency pulses, of generation of the gradient magnetic fields in the x, y, and z directions, and of reception of the nuclear magnetic resonance signal. The sequence control device 18 also functions to cause a data processing device 19 to carry out an image reconstruction based on the nuclear magnetic resonance signal received at the receiver 17 and a display device 21 to display an image through a console 20 which performs transmission and reception of information.

Figure 8:
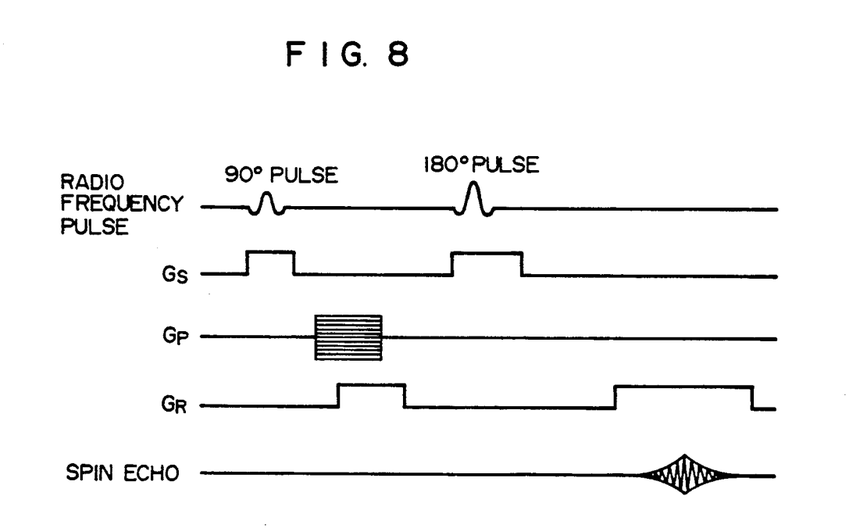
FIG. 8 is a diagram indicating the pulse sequence of the magnetic resonance imaging executed by using the device indicated in FIG. 7.

Referring to FIG. 8, a selective radio frequency 90° pulse is applied under the existence of a gradient magnetic field $G_s$ in the z axis direction for slice selection use. Thereby, a slice perpendicular to the z axis is selected. Namely, the nuclear spins in the slice are nutated by 90°. Thus the nutated spins are gradually dispersed.

Following above, a selective radio frequency 180° pulse is applied under the existence of the gradient magnetic field $G_s$, thereby the nuclear spins in the slice are inverted. The dispersed nuclear spins are gradually converged, and the nuclear magnetic resonance signal called a spin echo are generated from the whole of the slice.

Between the selective radio frequency 90° pulse and the selective radio frequency 180° pulse gradient magnetic field Gp in the y axis direction for phase encoding use is applied, and further, after the application of the selective radio frequency 180° pulse, a gradient magnetic field $G_R$ in the x direction for read-out use is applied, and during that time the spin echo signal is read.

The above step is repeated N times so as to generate N spin echo signals, wherein Gp is changed at every time so that its time integration changes at a predetermined rate.

For the respective spin echo signals, N samplings are applied, and the N spin echo signals each consisting of the respective signals sampled are subjected to two dimensional Fourier transformation processing. Thereby, a two dimensional nuclear magnetic resonance signal image of the slice of the x-y plane is obtained.

The gradient magnetic field $G_R$ for readout use is also applied between the both selective radio frequency pulses. This application is made for the compensation for dephase of the nuclear spins caused by the earlier half of the gradient magnetic field $G_R$ which is applied after the application of the selective radio frequency 180° pulse.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

We claim:

1. A nuclear magnetic resonance exciting device comprising:
    means for generating a static magnetic field—a sample being located therein—
    means for generating a gradient magnetic field;
    means for driving said gradient magnetic field generating means so as to superpose said gradient magnetic field on said static magnetic field;
    means for generating a radio frequency pulse; and
    means for exciting nuclear magnetic resonance of said sample by applying said radio frequency pulse under the presence of said gradient magnetic field;
    wherein said nuclear magnetic resonance exciting device comprises a gradient magnetic field system; said gradient magnetic field system comprises said gradient magnetic field generating means and an eddy current effect generating portion, where the eddy current effect is generated due to said gradient magnetic field; said means for driving said gradient magnetic field generating means comprises means for compensating said generated eddy current effect; and said eddy current effect compensating means has an inverse of the transmission function of said gradient magnetic field system as a transmission function.

2. A nuclear magnetic resonance exciting device according to claim 1, wherein said gradient magnetic field generating means includes a gradient magnetic field coil.

3. A nuclear magnetic resonance exciting device comprising:

means for generating a static magnetic field —a sample being located therein—
 a gradient magnetic field coil;
 means for exciting said gradient magnetic field coil so as to generate a gradient magnetic field, which is to be superposed on said static magnetic field;
 means for generating a radio frequency pulse; and
 means for exciting nuclear magnetic resonance of said sample by applying said radio frequency pulse under the presence of said gradient magnetic field;
 wherein said nuclear magnetic resonance exciting device comprises a gradient magnetic field system; said gradient magnetic field system comprises said gradient magnetic field generating coil and an eddy current effect generating portion, where the eddy current effect is generated due to said gradient magnetic field; said gradient magnetic field coil exciting means comprises means for compensating the magnetic field generated due to said generated eddy current; and said magnetic field compensating means has an inverse of the transmission function of said gradient magnetic field system as a transmission function.

4. A nuclear magnetic resonance exciting device according to claim 3, wherein said magnetic field compensating means includes a circuit having a transmission function given by $k_i T_i s/(1+T_i s)$, where $k_i$ represents an influence coefficient of eddy current and $T_i$ a time constant.

5. A nuclear magnetic resonance exciting device according to claim 4, wherein said circuit includes at least two operational amplifiers and parameter adjusting devices, each of which is added to each of said operational amplifiers.

6. A nuclear magnetic resonance exciting device according to claim 5, wherein a first of said parameter adjusting devices adjusts the influence coefficient of eddy current $k_i$ and the second adjusts the time constant $T_i$.

7. A gradient magnetic field generating device comprising:

a gradient magnetic field coil;
 means for exciting said gradient magnetic field coil so as to generate a gradient magnetic field;
 an eddy current generating portion, where the eddy current is generated due to said gradient magnetic field;
 wherein said gradient magnetic field generating device comprises a gradient magnetic field system; said gradient magnetic field system comprises said gradient magnetic field coil and said eddy current generating portion; said gradient magnetic field coil exciting means comprises means for compensating the magnetic field generated due to said generated eddy current; and said magnetic field compensating means has an inverse of the transmission function of said gradient magnetic field system as a transmission function.

8. A gradient magnetic field generating device according to claim 7, wherein said magnetic field compensating means includes a circuit having a transmission function given by $k_i T_i s/(1+T_i s)$, where $k_i$ represents an influence coefficient of eddy current and $T_i$ represents a time constant.

9. A nuclear magnetic resonance exciting device according to claim 8, wherein said circuit includes at least two operational amplifiers and parameter adjusting devices, each of which is added to each of said operational amplifiers.

10. A nuclear magnetic resonance exciting device according to claim 9, wherein a first of said parameter adjusting devices adjusts the influence coefficient of eddy current $k_i$ and the second adjusts the time constant $T_i$.

* * * * *